United States Patent [19]
Limberg

[11] 3,942,046
[45] Mar. 2, 1976

[54] LOW OUTPUT IMPEDANCE VOLTAGE DIVIDER NETWORK

[75] Inventor: Allen LeRoy Limberg, Somerville, N.J.

[73] Assignee: RCA Corporation, New York, N.Y.

[22] Filed: Jan. 10, 1972

[21] Appl. No.: 216,686

Related U.S. Application Data

[63] Continuation of Ser. No. 57,996, July 24, 1970, abandoned.

[52] U.S. Cl. .................. 307/297; 307/254; 330/13
[51] Int. Cl.² ......................................... H03K 17/00
[58] Field of Search ........ 330/22; 307/13, 296, 297, 307/254

[56] References Cited
UNITED STATES PATENTS

| | | |
|---|---|---|
| 3,089,098 | 5/1963 | Noe .................................... 330/22 |
| 3,383,612 | 5/1963 | Harwood ............................. 330/22 |
| 3,534,245 | 10/1970 | Limberg............................. 307/297 |
| 3,555,309 | 1/1971 | Limberg............................. 307/297 |

Primary Examiner—Stanley D. Miller, Jr.
Assistant Examiner—B. P. Davis
Attorney, Agent, or Firm—Eugene M. Whitacre; Kenneth R. Schaefer

[57] ABSTRACT

A low output impedance precision dynamic voltage divider network having low power dissipation and particularly suited for fabrication on a monolithic integrated circuit chip.

15 Claims, 4 Drawing Figures

LOW OUTPUT IMPEDANCE VOLTAGE DIVIDER NETWORK

This is a continuation of application Ser. No. 57,996, filed July 24, 1970, now abandoned.

This invention relates to voltage divider networks in general and, more particularly, to a dynamic voltage divider network having low output impedance, low power dissipation and particularly suited for fabrication with integrated circuit techniques.

As used herein, the term integrated circuit refers to a unitary or monolithic semiconductor device or chip incorporating the equivalent of a network of interconnected active and passive electrical circuit elements such as transistors, diodes, resistors, capacitors and the like.

In the design of semiconductor amplifiers to be fabricated on an integrated circuit substrate, it is frequently desirable to eliminate the conventional coupling capacitor; consequently, the direct current coupled amplifier is commonly utilized on integrated circuit chips. It is also customary to direct current couple successive stages and to provide such stages with fractional B+ supplies for biasing, as described in U.S. Pat. No. 3,383,612 granted to L. A. Harwood and assigned to the same assignee as the present invention. The output impedance of a voltage divider bias network must be significantly low at the signal frequency so that a negligible amount of signal voltage is developed across the bias network. This low output impedance bias network makes it possible to eliminate decoupling capacitors which would otherwise be required.

Developing a low impedance voltage divider network by means which utilize relatively low value resistors or other circuit networks that dissipate relatively large amounts of power is impractical since the small size of the integrated circuit chip severely limits the amount of power that can be safely dissipated.

The present invention provides an improved dynamic voltage divider network suitable for establishing and maintaining a voltage which is a preselected proportion of the input supply voltage and is independent of temperature. In addition, the present invention provides a dynamic voltage divider biasing network with low output impedance for signal frequency components and relatively low power dissipation.

A dynamic potential divider network in accordance with the present invention includes, first and second terminals for application of potentials and a third terminal to provide an intermediate potential output. First and second resistors are selected to maintain a prescribed resistance ratio. A first transistor has an emitter electrode coupled by said first resistor to said first terminal, a collector electrode direct current conductively coupled to said second terminal by a first current path including said second resistor, a base electrode, and a base-emitter junction between said base and emitter electrodes which is maintained in forward bias to permit common-emitter amplifier operation. Third and fourth resistors are connected in series, with their interconnection being direct current conductively coupled to the base electrode of said first transistor by a third current path, the end of said fourth resistor, remote from said interconnection, is returned to said first terminal. A second transistor has an emitter electrode direct current conductively coupled to said interconnection by means including said third resistor, a collector electrode direct current conductively coupled to said second terminal, a base electrode direct current conductively coupled to the collector electrode of said first transistor, whereby a second current path is established between the collector of said first transistor and the end of the third resistor remote from said interconnection. The second transistor base-emitter junction occurring between its base and emitter electrodes is maintained in forward bias to permit operation as a common-collector amplifier stage. The third terminal is connected at a point in the recited circuitry coupling the collector and base electrodes of said first transistor.

The ratio of the resistance of said second resistor to that of said first resistor is a positive number selected equal to the sum of: (1) the number of forward biased semiconductor junctions in said first current path, (2) the number of forward biased semiconductor junctions in said second current path, (3) the number of forward biased semiconductor junctions in said third current path, and (4) the number of forward biased semiconductor junctions in said third current path multiplied by the ratio of the resistances of said third resistor to said fourth resistor, whereby the potential at the base electrode of said first transistor is rendered substantially independent of variations in the offset potentials of said forward biased semiconductor junctions.

A complete understanding of the invention may be obtained from the following detailed description, when taken in conjunction with the accompanying drawings, in which.

Figure 1:
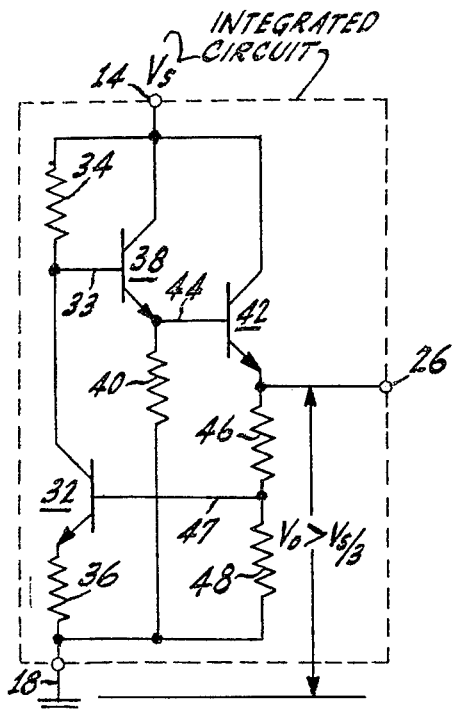
FIG. 1 is a schematic circuit diagram of a dynamic voltage divider constructed in accordance with the present invention.

In FIG. 1, a first transistor 32 is arranged in a degenerated common-emitter configuration, with its collector electrode connected to an energizing potential terminal 14 through a first series current path including a resistor 34. The emitter electrode of transistor 32 is connected to a reference terminal 18 through a series path including a resistor 36. A second transistor 38 arranged in a common-collector configuration has its collector electrode connected to terminal 14, its base electrode connected to the junction 33 of resistor 34 and the collector of transistor 38. The emitter of transistor 32 is connected through a series path, including resistor 40, to reference terminal 18. A third transistor 42, arranged in a common-collector configuration, has its collector connected to the energizing potential terminal 14 and its base is connected to the junction 44 of one side of resistor 40 and the emitter electrode of transistor 38. Resistor 40 is selected so that equal currents flow in transistors 38 and 42. The emitter of transistor 42 is connected in a series path including a voltage divider network, comprising resistors 46 and 48, to the reference ground 18. A second current path from the collector of transistor 32 to the remote end of resistor 46 includes the forward biased emitter-base junctions of transistors 38 and 42. The emitter electrode of transistor 42 is also connected to output terminal 26. The common connection 47 of resistors 46 and 48 is connected to the base of the first transistor 32 and comprises a third current path.

Figure 3:
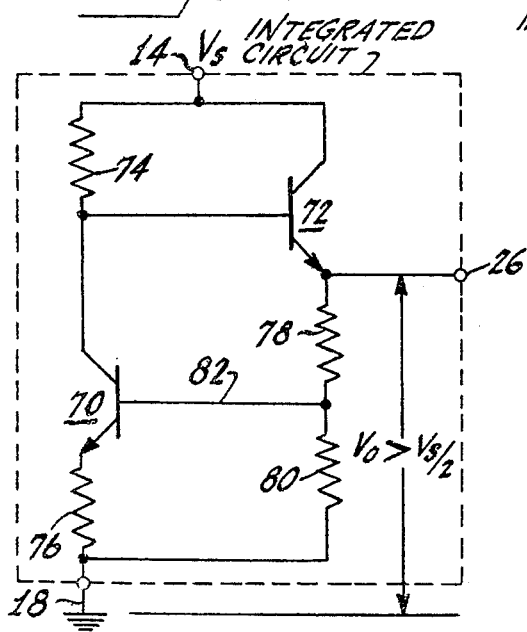
FIG. 3 is a schematic circuit diagram of a further alternate embodiment of the present invention.

The embodiment in FIG. 1 provides output voltages greater than one-third the source voltage ($V_s/3$) which are temperature independent. [Output voltage range $V_s/3$ to ($V_s - 2V_{be}$).] Although the configuration of FIG. 1 provides output voltages greater than $V_s/2$, the configuration of FIG. 3 is capable of providing these voltages with fewer components.

The independence of the output voltage ($V_o$) with respect to temperature changes, for the first embodiment of the invention (FIG. 1), is obtained with the proper selection of resistance ratios and is demonstrated with the following mathematical analysis:

The voltage appearing at junction 47, which is the base electrode of the degenerated common-emitter transistor 32, may be expressed as:

$$V_{b_{32}} = V_o \left( \frac{R_{48}}{R_{46} + R_{48}} \right) \qquad \text{Eq. (1)}$$

Letting $$\left( \frac{R_{48}}{R_{46} + R_{48}} \right) = \frac{1}{k}$$

and substituting in Equation (1) yields:

$$V_{b_{32}} = \frac{V_o}{k} \qquad \text{Eq. (2)}$$

The voltage appearing at the emitter electrode of transistor 32, which is also the voltage across resistor 36, ($V_{R_{36}}$), may be shown to be:

$$V_{R_{36}} = V_{e_{32}} = \frac{V_o}{k} - V_{be} \qquad \text{Eq. (3)}$$

where $V_{be}$ is the voltage offset across the emitter-base junction of transistor 32.

Let the ratio of $R_{34}/R_{36}$ be equal to g, then, if it is assumed that the emitter and collector current of transistor 32 are approximately equal, the voltage across $R_{34}$ is equal to:

$$V_{R_{34}} = gV_{R_{36}} \qquad \text{Eq. (4)}$$

Substituting Equation (3) in Equation (4) yields:

$$V_{R_{34}} = g \left[ \frac{V_o}{k} - V_{be} \right] \qquad \text{Eq. (5)}$$

The voltage appearing at the base electrode of common collector transistor 38 is:

$$V_{b_{38}} = V_s - V_{R_{34}} \qquad \text{Eq. (6)}$$

Substituting Equation (5) into Equation (6) yields:

$$V_{b_{38}} = V_s - g \left( \frac{V_o}{k} - V_{be} \right) \qquad \text{Eq. (7)}$$

The voltage appearing at the base electrode of common collector transistor 42 is one base-emitter offset ($-V_{be}$) lower yielding:

$$V_{b_{42}} = V_s - g \left( \frac{V_o}{k} - V_{be} \right) - V_{be} \qquad \text{Eq. (8)}$$

The voltage at the emitter electrode of transistor 42 is another base-emitter offset ($-V_{be}$) lower and is also equal to the output voltage $V_o$. Thus:

$$V_{e_{42}} = V_o = V_s - g \left( \frac{V_o}{k} - V_{be} \right) - 2V_{be} \qquad \text{Eq. (9)},$$

and $$V_o = V_s - (g/k) V_o + gV_{be} - 2V_{be} \qquad \text{Eq. (10)}.$$

Combining like terms, yields:

$$V_o (1 + g/k) = V_s + (g - 2) V_{be} \qquad \text{Eq. (11)}.$$

Rearranging yields:

$$V_o = \frac{V_s}{1 + g/k} + \left( \frac{g - 2}{1 + g/k} \right) V_{be} \qquad \text{Eq. (12)}.$$

The ratios of resistors g and k are not functions of temperature. Therefore, the output voltage ($V_o$) is made independent of temperature if the second part of Equation (12), which is temperature sensitive (function of $V_{be}$), is set equal to zero.

$$\text{Setting} \left( \frac{g - 2}{1 + g/k} \right) V_{be} = 0 \qquad \text{Eq. (13)}$$

yields:

$$g = 2 \qquad \text{Eq. (14)}.$$

Then, since $g = R_{34}/R_{36}$, making $R_{34}$ twice as large as $R_{36}$ or, $$R_{34} = 2R_{36} \qquad \text{Eq. (15)}$$

will yield an output voltage independent of temperature. The output voltage will be, from Equation (12):

$$V_o = \frac{V_s}{1 + g/k} = \frac{V_s}{1 + 2/k} = \left( \frac{k}{k + 2} \right) V_s \qquad \text{Eq. (16)}.$$

When k is greater than unity, $R_{46}$ is greater than zero, and the output voltage may be selected to be any value between $V_s/3$ and ($V_s - V_{be}$).

Figure 4:
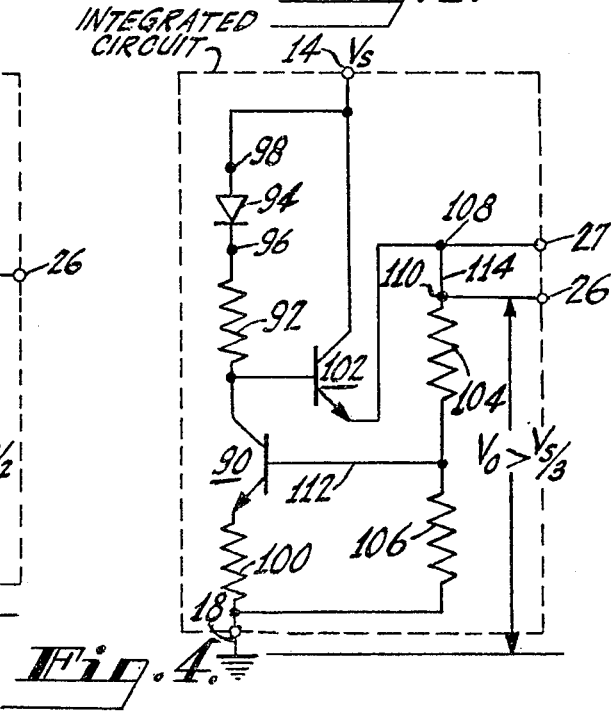
FIG. 4 is a schematic circuit diagram of another alternate embodiment of the present invention.

FIG. 4 is an alternate embodiment of the present invention for output voltages greater than one-third the source voltage ($V_s/3$). [Output voltage range $V_s/3$ to ($V_s - 2V_{be}$).] The embodiment of FIG. 4 is more stable than the embodiment of FIG. 1 at high frequencies, since fewer common-collector transistor amplifier stages are used in the embodiment of FIG. 4, reducing the phase shift around the loop.

In FIG. 4, a first transistor 90 is arranged in a degenerated common-emitter configuration with its collector electrode connected to an energizing potential terminal 14 through a first series current path including a resistor 92, and terminals 96 and 98, between which, a diode 94 is shown connected. The emitter electrode of transistor 90 is coupled to a reference terminal 18 by resistor 100. A second transistor 102 arranged in a common-collector configuration has its collector electrode connected to terminal 14, its base electrode connected to the junction of resistor 92 and the collector of transistor 90. The emitter electrode of transistor 102 is connected to output terminal 27 and through a series path, including a voltage divider network, comprising resistors 104, 106; and points 108 and 110 to a reference terminal 18. A second current path from the collector of transistor 90 to the remote end of resistor 104 includes the forward biased emitter-base junction of transistor 102 and also includes any forward biased semiconductor appearing between points 108 and 110. The common connection 112 of resistors 104 and 106 is connected to the base electrode of transistor 90 and is a third current path.

The manner in which component values are chosen to provide an output voltage ($V_o$) independent of temperature, for the embodiment of FIG. 4 is the same as that shown for FIG. 1 above, noting that voltage across diode 94 replaces the base-emitter voltage offset ($-V_{b-e}$) for transistor 38 of FIG. 1. Diode 94 is constructed with the same geometry as the base-emitter electrodes of transistors 90 and 102 and will therefore have approximately the same voltage across it as the base-emitter electrodes ($V_{b-e}$).

When a direct connection 114 is connected between points 108 and 110, which are connected to terminals 27 and 26 respectively, the voltage appearing between terminals 26, 27 and reference terminal 18 will be the same, greater than $V_s/3$, and independent of temperature.

However, it is also to be noted that if the diode appearing between points 96 and 98 is replaced with a direct connection, and, at the same time, the direct connection 114 is replaced with a diode 94, the mathematical expressions above show that the voltage between terminal 26 and the reference terminal 18 is still independent of temperature and greater than $V_s/3$, while the voltage between terminals 27 and 18 is one $V_{b-e}$ higher and varies with temperature. The voltage between terminals 27 and 18 is used when a bias voltage is required that is a portion of the source of potential and is capable of tracking transistor $V_{b-e}$ changes with temperature, e.g., in biasing a common-emitter amplifier stage with a collector load resistor and an emitter degeneration resistor to obtain a temperature-independent voltage across the collector load resistor.

Figure 2:
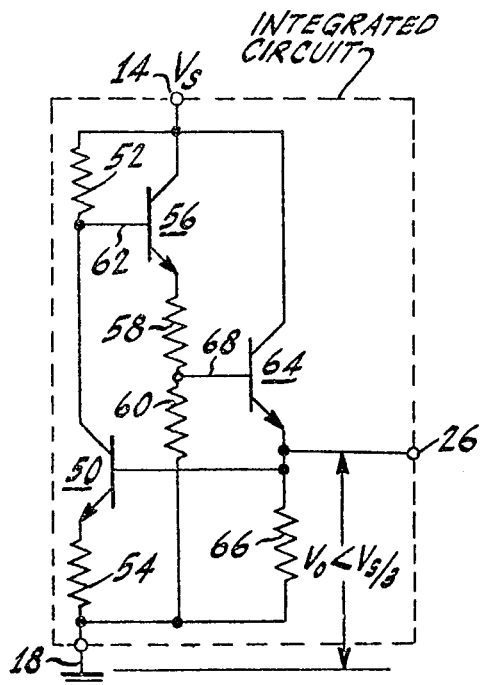
FIG. 2 is a schematic circuit diagram of an alternate embodiment of the present invention.

When an output voltage of less than one-third of the supply voltage is required, the alternate embodiment shown in FIG. 2 is used. A first transistor 50 is arranged in a degenerated common-emitter configuration with its collector electrode connected to a source of DC voltage ($V_s$) at terminal 14 through a first series current path including a first resistor 52. The emitter electrode of transistor 50 is connected to a reference terminal 18 through a second resistor 54. A second transistor 56 arranged in a common-collector configuration, with its collector electrode connected to the source of DC potential ($V_s$) at terminal 14, has its emitter electrode connected in a series path including a voltage divider network, comprising resistors 58 and 60, to the reference ground terminal 18. The base electrode of transistor 56 is connected to the junction 62 of resistor 52 and the collector electrode of transistor 50. A third transistor 64, arranged in a common-collector configuration, has its collector electrode connected to the voltage source ($V_s$) at terminal 14, while its emitter electrode is connected through a series path, including resistor 66, to the reference terminal 18, to the output terminal 26, and to the base electrode of the first transistor 50.

Resistor 66 is selected so that equal currents flow in transistors 56 and 64. A second current path from the collector of transistor 50 to the remote end of resistor 58 includes the forward biased emitter-base junction of transistor 56. The base electrode of the third transistor 64 is connected to the common connection 68 of resistors 58 and 60. A third current path from the common connection 68 of resistors 58 and 60 to the base of the first transistor 50 includes the forward biased emitter-base junction of transistor 64.

The independence of the output voltage ($V_o$) with respect to temperature changes, for the alternate embodiment of the invention (FIG. 2), is obtained with the proper selection of resistance ratios and is demonstrated with the following equations.

The output voltage ($V_o$) is related to the voltage across $R_{54}$ by the expression:

$$V_{R_{54}} = V_o - V_{be} \qquad \text{Eq. (17)}.$$

Assuming the emitter and collector currents of transistor 50 to be approximately equal and letting $R_{52}/R_{54} = g$, then the voltage across resistor 52 is:

$$V_{R_{52}} = (V_o - V_{be})g, \qquad \text{Eq. (18)};$$

and the voltage at the base electrode of the common-collector transistor 56 is therefore, $$V_{b_{56}} = V_s - (V_o - V_{be})g \qquad \text{Eq. (19)}.$$

The voltage appearing at the emitter electrode of transistor 56 is the same voltage appearing across the series connected resistors 58 and 60 and is one base-emitter offset ($-V_{be}$) less than the voltage appearing at the base electrode of transistor 56 and may be shown to be:

$$V_{e_{56}} = V_s - (V_o - V_{be})g - V_{be} \qquad \text{Eq. (20)}.$$

Setting the ratio $$\frac{R_{60}}{R_{58} + R_{60}}$$

equal to $1/k$, the voltage appearing across resistor 60 is expressed as:

$$V_{R_{60}} = 1/k \, [V_s - (V_o - V_{be})g - V_{be}] \qquad \text{Eq. (21)}.$$

which is the same as the voltage at the base electrode of common-collector transistor 64. The output voltage ($V_o$) is one emitter-base voltage offset ($-V_{be}$) lower and is the same voltage that appears at the emitter of transistor 64 which is shown to equal:

$$V_o = 1/k \, [V_s - (V_o - V_{be})g - V_{be}] - V_{be} \qquad \text{Eq. (22)};$$

then $$(V_o + V_{be})k = V_s - (V_o - V_{be})g - V_{be} \qquad \text{Eq. (23)};$$

and, $$kV_o + kV_{be} = V_s - gV_o + gV_{be} - V_{be} \qquad \text{Eq. (24)};$$

and, $$(k + g)V_o = V_s + (g - k - 1)V_{be} \qquad \text{Eq. (25)};$$

Therefore, $$V_o = \frac{V_s}{(k+g)} + \frac{(g-k-1)V_{be}}{(k+g)} \qquad \text{Eq. (26)}.$$

Separating the temperature dependent terms from the temperature independent terms, and setting the temperature dependent terms equal to zero, recalling that the resistance ratios $g$ and $k$ are not a function of temperature, yields:

$$\frac{(g-k-1)V_{be}}{(k+g)} = 0 \qquad \text{Eq. (27)}$$

and, $$g = k + 1 \qquad \text{Eq. (28)}.$$

Since, $g = R_{52}/R_{54}$ and $$k = \frac{R_{58} + R_{60}}{R_{60}}$$

then;

$$\frac{R_{52}}{R_{54}} = \frac{R_{58} + R_{60}}{R_{60}} + 1 \qquad \text{Eq. (29)}$$

which shows that with a proper selection of resistor values the output voltage ($V_o$) is independent of temperature variations and is equal to:

$$V_o = \frac{V_s}{(k+g)} = \frac{V_s}{(k+k+1)} = \frac{V_s}{(2k+1)} \qquad \text{Eq. (30)};$$

$$V_o = \frac{V_s}{2\left(\frac{R_{58} + R_{60}}{R_{60}}\right) + 1} \qquad \text{Eq. (31)}.$$

Rearranging terms, $$V_o = V_s \left(\frac{R_{60}}{2R_{58} + 3R_{60}}\right) \qquad \text{Eq. (32)}$$

If resistor 58 is made greater than zero ($k > 1$), then the output voltage is:

$$V_o < V_s/3 \qquad \text{Eq. (33)}.$$

and may be selected to be any value between $V_s/3$ and $V_{be}$.

When a temperature independent output voltage ($V_o$) greater than $V_s/2$ is required, a further embodiment of the present invention shown in FIG. 3 is utilized. [Output voltage range of $V_s/2$ to ($V_s - V_{be}$).]

The dynamic voltage divider network of FIG. 3 includes a pair of transistors 70 and 72. One transistor 70 is arranged in a degenerated common-emitter configuration, with its collector electrode connected to an energizing potential terminal 14 through a first series current path including a first resistor 74. A source of DC voltage ($V_s$) is applied to terminal 14. Transistor 70 has its emitter electrode connected to a reference terminal 18 through a series path including a second resistor 76. A second transistor 72 is arranged in a common-collector configuration with its collector electrode connected to the energizing potential terminal 14 and its base electrode connected to the collector electrode of the first transistor 70. The emitter electrode of transistor 72 is connected in a series path, including a voltage divider network, comprising resistors 78 and 80 to reference terminal 18. A second current path from the collector of transistor 70 to the remote end of resistor 78 includes the forward biased emitter-base junction of transistor 72. The emitter electrode of transistor 72 is also connected to output terminal 26. The common connection 82 of resistors 78 and 80 is connected to the base electrode of transistor 70 and comprises a third current path.

The manner in which component values are chosen to provide an output voltage ($V_o$) independent of temperature, for the embodiment of FIG. 3, is described as follows:

Assuming the currents flowing in the collector and emitter of transistor 70 are approximately equal, selecting the resistor ratio $$\frac{R_{78} + R_{80}}{R_{80}}$$

equal to a value $k$, and selecting $R_{74}/R_{76}$ equal to a value g, then the voltage at the base electrode of the degenerated common-emitter transistor 70 may be shown to be equal to $V_o/k$. The voltage across resistor 76 is the same as the voltage at the emitter electrode of transistor 70 and is one base-emitter offset ($-V_{be}$) lower and is equal to:

$$V_{R_{76}} = \frac{V_o}{k} - V_{be} \qquad \text{Eq. (35)}.$$

The voltage drop across resistor 74 is $g$ times the drop across resistor 76 and is:

$$V_{R_{74}} = g\left(\frac{V_o}{k} - V_{be}\right) \qquad \text{Eq. (36)}.$$

The voltage at the base electrode of common-collector transistor 72 is equal to the power supply voltage ($V_s$) less the voltage drop across resistor 74 and is:

$$V_{b_{72}} = V_s - g\left(\frac{V_o}{k} - V_{be}\right) \qquad \text{Eq. (37)}.$$

The output voltage $V_o$ being one emitter-base voltage offset ($-V_{be}$) lower is then equal to:

$$V_o = V_s - g\left(\frac{V_o}{k} - V_{be}\right) - V_{be} \qquad \text{Eq. (38)}.$$

Combining and separating temperature dependent terms from temperature independent terms yields:

$$V_o = V_s - g\frac{V_o}{k} + (g-1)V_{be} \qquad \text{or}$$

$$\left(1 + \frac{g}{k}\right)V_o = V_s + (g-1)V_{be} \qquad \text{and};$$

$$V_o = \frac{V_s}{1 + \frac{g}{k}} + \frac{(g-1)V_{be}}{1 + \frac{g}{k}} \qquad \text{Eq. (39)}.$$

Setting the temperature dependent terms of Equation (39) equal to zero again provides the circuit parameters necessary to make the circuit temperature independent.

$$\frac{(g-1)V_{be}}{1+\frac{g}{k}} = 0 \quad \text{Eq. (40).}$$

Therefore, for $g = 1$ (that is resistor 74 the same resistance value as resistor 76), the output voltage $V_o$ will be independent of temperature.

The output voltage from Equation (39) under this condition becomes:

$$V_o = \frac{V_s}{1+\frac{g}{k}} = \frac{kV_s}{k+g} \quad \text{Eq. (41).}$$

Since $g$ is equal to unity;

$$V_o = \frac{kV_s}{k+1} \text{ and} \quad \text{Eq. (42)}$$

with $k > 1$, $V_o$ is $> V_s/2$.

Circuit means have been described for obtaining desired proportions of a voltage source which are independent of temperature variations. The voltage division is dependent only upon the proper selection of resistor ratios, a relationship which is readily controllable by standard techniques in the manufacture of monolithic integrated circuit chips.

It is also to be noted that the assumptions made to mathematically demonstrate the temperature independence of the present invention are properly justified when the voltage divider circuit is fabricated on a monolithic integrated circuit chip, since the semiconductors all operate at substantially the same temperature, with substantially the same current levels in each, are constructed with the same geometry, and therefore have substantially equal emitter-base voltage drops. Although the application of the present invention is not limited to integrated circuit techniques, the use of discrete components would require matched semiconductors.

What is claimed is:

1. A dynamic potential divider having first and second terminals for application of potentials and a third terminal to provide intermediate potential output comprising:

first and second resistors;

a first transistor having an emitter electrode coupled by said first resistor to said first terminal, a collector electrode direct current conductively coupled to said second terminal by a first current path including said second resistor, a base electrode, and a base-emitter junction between said base and emitter electrodes to be maintained in forward bias to permit common-emitter amplifier operation thereof;

third and fourth resistors in series connection, their interconnection with each other being direct current conductively coupled to said base electrode of said first transistor by a third current path, the end of said fourth resistor remote from said interconnection returned to said first terminal; and a second transistor having an emitter electrode direct current conductively coupled to said interconnection by means including said third resistor, a collector electrode direct current conductively coupled to said second terminal, a base electrode direct current conductively coupled to the collector electrode of said first transistor, whereby a second current path is established between the collector of said first transistor and the end of the third resistor remote from said interconnection, and a base-emitter junction between its said base and emitter electrodes to be maintained in forward bias to permit operation as a common-collector amplifier stage, said third terminal being connected at a point in the recited circuitry coupling the collector and base electrodes of said first transistor;

the ratio of the resistance of said second resistor to that of said first resistor being a positive number equal to the sum of (1) the number of forward biased semiconductor junctions in said first current path; (2) the number of forward biased semiconductor junctions in said second current path; (3) the number of forward biased semiconductor junctions in said third current path; and (4) the number of forward biased semiconductor junctions in said third current path multiplied by the ratio of the resistances of said third resistor to said fourth resistor, whereby the potential at the base electrode of said first transistor is rendered substantially independent of variations in the offset potentials of said forward biased semiconductor junctions caused by temperature changes.

2. A dynamic potential divider according to claim 1 wherein the number of said forward biased semiconductor junctions in said second current path is two.

3. A dynamic potential divider according to claim 1 wherein the number of said forward biased semiconductor junctions in said second current path is one and the number of forward biased semiconductor junctions in said third current path is one.

4. A dynamic potential divider according to claim 1 wherein the number of said forward biased semiconductor junctions in said second current path is one.

5. A dynamic potential divider according to claim 1 wherein the number of said forward biased semiconductor junctions in said first current path is one and the number of forward biased semiconductor junctions in said second current path is one.

6. A dynamic potential divider according to claim 2 wherein said first, second, third, and fourth resistors are selected according to the following expressions:

$$R_2 = 2R_1, \text{ and } \frac{R_3 + R_4}{R_4} > 1$$

for providing an output voltage greater than one-third said source of potential.

7. A dynamic potential divider according to claim 3 wherein said first, second, third, and fourth resistors are selected according to the following expressions:

$$\frac{R_2}{R_1} = \frac{R_3 + R_4}{R_4} + 1, \text{ and } \frac{R_3 + R_4}{R_4} > 1$$

for providing an output voltage less than one-third said source of potential.

8. A dynamic potential divider according to claim 4 wherein said first, second, third, and fourth resistors are selected according to the following expressions:

$$R_1 = R_2, \text{ and } \frac{R_3 + R_4}{R_4} > 1$$

for providing an output voltage greater than one-half of said source of potential.

9. A dynamic potential divider according to claim 5 wherein said first, second, third, and fourth resistors are selected according to the following expressions:

$$R_2 = 2R_1, \text{ and } \frac{R_3 + R_4}{R_4} > 1$$

for providing an output voltage greater than one-third said source of potential.

10. A dynamic potential divider network having first and second terminals for application of a source of potential and a third terminal to provide intermediate potential output comprising:
   a first transistor having emitter, base and collector electrodes;
   first and second resistors, said first resistor coupling the emitter electrode of said first transistor to said first terminal, said second resistor coupling the collector electrode of said first transistor to said second terminal;
   a second transistor having emitter, base and collector electrodes, the collector electrode of said second transistor being coupled to said second terminal, the base of said second transistor being coupled to the collector of said first transistor;
   third and fourth resistors coupled in series, their common connection being coupled to the base electrode of said first transistor, the end of said fourth resistor remote from said common connection being coupled to said first terminal, the end of said third resistor remote from said common connection being connected to the emitter of said second transistor; and
   said first, second, third, and fourth resistors being selected according to the expressions, $$R_1 = R_2 \text{ and } \frac{R_3 + R_4}{R_4} > 1$$

for providing an output voltage greater than one-half of said source of potential between said third and first terminals, said third terminal being coupled to a point in the circuit path between the collector and base electrodes of said first transistor, said output voltage being independent of temperature and being a predetermined portion of said source of potential according to said resistor ratios.

11. A dynamic potential divider network having first and second terminals for application of a source of potential and a third terminal to provide intermediate potential output and comprising:
   a first transistor having emitter, base and collector electrodes;
   first and second resistors, said first resistor coupling the emitter electrode of said first transistor to said first terminal, said second resistor coupling the collector electrode of said first transistor to said second terminal;
   a second transistor having emitter, base and collector electrodes, the collector electrode of said second transistor being coupled to said second terminal;
   third and fourth resistors coupled in series, their common connection being coupled to the base electrode of said first transistor, the end of said fourth resistor remote from said common connection being coupled to said first terminal, the end of said third resistor remote from said common connection being connected to the emitter of said second transistor;
   a third transistor having emitter, base and collector electrodes, the collector electrode of said third transistor being coupled to said second terminal, the emitter electrode being coupled to the base of said second transistor and means coupling said emitter electrode of said third transistor to said first terminal, the base electrode of said third transistor being coupled to the collector electrode of said first transistor; and
   said first, second, third, and fourth resistors being selected according to the expressions, $$R_2 = 2R_1 \text{ and } \frac{R_3 + R_4}{R_4} > 1,$$

for providing an output voltage greater than one-half of said source of potential between said third and first terminals, said third terminal being coupled to a point in the circuit path between the collector and base electrodes of said first transistor.

12. A dynamic potential divider network having first and second terminals for application of potentials and a third terminal to provide intermediate potential output and comprising:
   a first transistor having emitter, base and collector electrodes;
   first and second resistors, said first resistor coupling the emitter electrode of said first transistor to said first terminal, said second resistor coupling the collector electrode of said first transistor to said second terminal;
   a second transistor having emitter, base and collector electrodes, the collector electrode of said second transistor being coupled to said second terminal, the base of said second transistor being coupled to the collector of said first transistor;
   third and fourth resistors coupled in series to provide a common connection, the end of said fourth resistor remote from said common connection being coupled to said first terminal, the end of said third resistor remote from said common connection being connected to the emitter of said second transistor;
   a third transistor having emitter, base and collector electrodes, the collector electrode of said third transistor being coupled to said second terminal, the emitter of said third transistor being coupled to the base of said first transistor and means coupling the emitter of said third transistor to said first terminal, the base electrode of said third transistor being coupled to the common connection of said third and fourth resistor; and
   said first, second, third, and fourth resistors being selected according to the expressions, $$\frac{R_2}{R_1} = \frac{R_3 + R_4}{R_4} + 1 \text{ and } \frac{R_3 + R_4}{R_4} > 1.$$

for providing an output voltage greater than one-half of said source of potential between said third and first terminal, said third terminal being coupled to a point in the circuit path between the collector and base electrodes of said first transistor.

13. A dynamic potential divider network having first and second terminals for application of a source of potential and a third terminal to provide intermediate potential output comprising:
- a first transistor having emitter, base and collector electrodes;
- a first resistor coupling the emitter electrode of said first transistor to said first terminal;
- means including a second resistor coupling the collector electrode of said first transistor to said second terminal;
- a second transistor having emitter, base and collector electrodes, the collector electrode of said second transistor being coupled to said second terminal, the base of said second transistor being coupled to the collector of said first transistor;
- voltage divider means, including third and fourth resistors having a common connection and two remote ends, said common connection being coupled to the base electrode of said first transistor, the first remote end of said voltage divider means being coupled to said first terminal, the second remote end of said voltage divider means being connected to the emitter of said second transistor for providing a portion of the voltage appearing between the emitter of said second transistor and said first terminal; and
- said first, second, third, and fourth resistors being selected according to the expressions, $$R_2 = 2R_1 \text{ and } \frac{R_3 + R_4}{R_4} > 1$$

for providing an output voltage greater than one-third of said source of potential between said third and first terminals, said third terminal being coupled to a point in the circuit path between the collector and base electrodes of said first transistor, said output voltage being independent of temperature and being a predetermined portion of said source of potential according to said resistor ratios.

14. A dynamic potential divider network having first and second terminals for application of a source of potential and a third terminal to provide intermediate potential output comprising:
- a first transistor having emitter, base and collector electrodes;
- a first resistor coupling the emitter electrode of said first transistor to said first terminal;
- means including a second resistor and a diode serially coupled thereto coupling the collector electrode of said first transistor to said second terminal;
- a second transistor having emitter, base and collector electrodes, the collector electrode of said second transistor being coupled to said second terminal, the base of said second transistor being coupled to the collector of said first transistor;
- voltage divider means, including third and fourth resistors having a common connection and two remote ends, said common connection being coupled to the base electrode of said first transistor, the first remote end of said voltage divider means being coupled to said first terminal, the second remote end of said voltage divider means being connected to the emitter of said second transistor for providing a portion of the voltage appearing between the emitter of said second transistor and said first terminal; and
- said first, second, third, and fourth resistors being selected according to the expressions, $$R_2 = 2R_1 \text{ and } \frac{R_3 + R_4}{R_4} > 1$$

for providing an output voltage greater than one-third of said source of potential between said third and first terminals, said third terminal being coupled to a point in the circuit path between the collector and base electrodes of said first transistor, said output voltage being independent of temperature and being a predetermined portion of said source of potential according to said resistor ratios.

15. A dynamic potential divider network having first and second terminals for application of a source of potential and a third terminal to provide intermediate potential output comprising:
- a first transistor having emitter, base and collector electrodes;
- a first resistor coupling the emitter electrode of said first transistor to said first terminal;
- means including a second resistor coupling the collector electrode of said first transistor to said second terminal;
- a second transistor having emitter, base and collector electrodes, the collector electrode of said second transistor being coupled to said second terminal, the base of said second transistor being coupled to the collector of said first transistor;
- voltage divider means, including third and fourth resistors having a common connection and two remote ends, and a diode serially coupled with said third resistor, coupled between the emitter of said second transistor and said common connection, said fourth resistor being coupled between said common connection and said first terminal, said common connection being coupled to the base electrode of said first transistor, the first remote end of said voltage divider means being coupled to said first terminal, the second remote end of said voltage divider means being connected to the emitter of said second transistor for providing a portion of the voltage appearing between the emitter of said second transistor and said first terminal; and
- said first, second, third, and fourth resistors being selected according to the expressions, $$R_2 = 2R_1 \text{ and } \frac{R_3 + R_4}{R_4} > 1$$

for providing an output voltage greater than one-third of said source of potential between said third and first terminals, said third terminal being coupled to a point in the circuit path between the collector and base electrodes of said first transistor, said output voltage being independent of temperature and being a predetermined portion of said source of potential according to said resistor ratios.

* * * * *